United States Patent [19]

Laird et al.

[11] Patent Number: 5,180,937
[45] Date of Patent: Jan. 19, 1993

[54] DELAY COMPENSATOR AND MONITOR CIRCUIT HAVING TIMING GENERATOR AND SEQUENCER

[75] Inventors: Douglas Laird, Los Gatos; Godfrey P. D'Souza, Santa Clara, both of Calif.

[73] Assignee: LSI Logic Corporation, Milpitas, Calif.

[21] Appl. No.: 843,700

[22] Filed: Feb. 28, 1992

[51] Int. Cl.⁵ .......................................... H03K 5/159
[52] U.S. Cl. .................................. 307/602; 307/603; 307/605; 307/606; 307/595; 307/597; 328/55; 328/66
[58] Field of Search ............... 307/602, 603, 605, 606, 307/595, 597; 328/55, 66

[56] References Cited

U.S. PATENT DOCUMENTS

| | | | |
|---|---|---|---|
| 4,504,749 | 3/1985 | Yoshida | 307/602 |
| 4,626,716 | 12/1986 | Miki | 307/602 |
| 4,737,670 | 4/1988 | Chan | 307/602 |
| 4,755,704 | 7/1988 | Flora et al. | 307/602 |
| 4,878,028 | 10/1989 | Wang et al. | 307/602 |
| 5,013,944 | 5/1991 | Fischer et al. | 328/55 |
| 5,087,842 | 2/1992 | Pulsipher et al. | 328/55 |

Primary Examiner—William L. Sikes
Assistant Examiner—Trong Phan
Attorney, Agent, or Firm—Skjerven, Morrill, Macpherson, Franklin & Friel

[57] ABSTRACT

A delay compensator circuit is disclosed to compensate for variations in temperature, supply voltage and process. A monitor circuit is further disclosed that allows the monitoring of the delay of a delay element. The delay compensator circuit and monitor circuit lend themselves easily to the ASIC design methodology since they use conventional ASIC building blocks; namely gates, memory elements and delay elements. The delay compensator and monitor use a time base to track variations in circuit parameters by monitoring the delay through a delay element (delay line or sub-circuit). Compensation may be achieved by switching delays in or out of the circuit to be compensated based on variations of temperature, voltage, and process as measured using the time base. The delay compensator permits the designer to control the output hold time independently of the output delay time. The delay compensator enables a latching device to hold the output signal for the required duration after a reference.

7 Claims, 5 Drawing Sheets

DELAY COMPENSATOR AND MONITOR CIRCUIT HAVING TIMING GENERATOR AND SEQUENCER

BACKGROUND OF THE INVENTION

1. Field of the Invention

This invention relates to delay compensator circuits that compensate for propagation delay variation caused by varying circuit parameters such as supply voltage, temperature, and process. This invention also relates to delay monitor circuits.

2. Description of the Relevant Art

Several parameters influence the propagation delay through electrical circuits. Variations in supply voltage, generally termed as VCC or VDD, with respect to a reference potential, generally termed as GND or VSS, cause corresponding variations in the delay through semiconductor circuits. In particular, the delay of CMOS circuits decreases with an increase in supply-to-reference potential.

Variations in temperature also affect delays through semiconductor circuits. Delays in CMOS circuits decrease with a decrease in temperature, usually quantified in terms of junction temperature.

In addition, semiconductor circuits also suffer from variations in the accuracy of the various steps in fabrication. These variations in fabrication are often referred to as process variations. Process variations could increase or decrease the delay through the circuits. These and other variations may apply similarly to circuits other than silicon circuits.

As a result of these varying conditions, manufacturers guarantee the operation of their devices over temperature and voltage ranges. ASIC manufacturers also provide to the customer or designer the variations in circuit delays that may be expected as a result of process, temperature and voltage variations. A CMOS circuit has the least delay when the supply voltage is the highest, the temperature is the lowest and process is "best", as specified by the manufacturer. "Best process" refers to the case when the circuit has the least propagation delays as a result of variations due to manufacturing inaccuracies. This combination of parameters is termed as "best case conditions", while lowest voltage, highest temperature and "worst" process is termed as "worst case conditions". The typical case is also generally quantified in terms of "typical" temperature, voltage and process conditions. The typical case indicates the most common temperature and voltage operating conditions as well as process.

As a result, there is a wide variation between the extremes "best case conditions" and "worst case conditions". Designers try to design circuits to be functional over this range. However, it is often difficult to achieve this goal if circuit requirements are aggressive. It is often necessary to provide a means to compensate circuit delays with changes in parameters such as temperature, voltage and process. A classical example where such compensation may be required is a circuit whose output has an output delay time and output hold time requirement from some reference. The output delay time of the signal is governed by the "worst case" or the slowest of the longest path, while the output hold of the signal is governed by the "best case" or fastest of the shortest path. A problem immediately arises if the requirements on the circuit are such that the ratio of the output delay time to the hold time is less than the "worst case" to "best case" variation. In this case, if the circuit is designed to meet the output delay time requirement, the circuit fails the output hold time requirement. Conversely, if the circuit is designed to meet the output hold time requirement, the output delay time requirement cannot be met.

Conventional methods for compensation include solutions from careful delay balancing of all related paths and circuit design of custom non-time base circuits that monitor process, temperature and voltage variations. Custom circuits that monitor such variations use circuit design techniques that enable a latch to hold the output for the required time after the reference. These circuits are carefully crafted to achieve this "process tracking" property and usually rely heavily on the fabrication process. Once fabricated correctly, these circuits track with changes in temperature, voltage and process.

Another technique has been detailed in U.S. Pat. No. 4,737,670, titled "Delay Control Circuit". This technique involves the use of a ring oscillator having a frequency that is inversely proportional to the propagation delays of the elements to calibrate the process, voltage and speed points of the circuit. The calibration information is used to switch the required delays into the circuit path that failed to meet the design specifications.

Careful delay balancing is often constrained severely by physical factors that may make it impossible to achieve such output hold and delay requirements concurrently without resorting to more sophisticated solutions. Custom circuit designs that track process require careful construction and are not available to the ASIC (Applications Specific Integrated Circuit) customer or designer. A limited set of pre-designed sub-circuits are available to an ASIC designer as building blocks. Custom circuits are a luxury for the ASIC designer.

In addition, solutions involving the use of ring oscillators also suffer from the limitation that ring oscillators of the required kind are not available as building blocks from most ASIC manufacturers.

SUMMARY OF THE INVENTION

In accordance with the present invention, a delay compensator and monitor circuit lends itself easily to the ASIC design methodology since it uses conventional ASIC building blocks; namely gates, memory elements and delay elements; and does not require special and custom circuit designs to solve this specific problem. The delay compensator uses a time base to track variations in circuit parameters by monitoring the delay through a delay element (delay line or sub-circuit). Compensation may be achieved by switching delays in or out of the circuit to be compensated based on variations of temperature, voltage, and process as measured using the time base. The delay compensator permits the designer to control the output hold time independently of the output delay time. The delay compensator enables a latching device to hold the output signal for the required duration after a reference.

These and other advantages are achieved with the present invention, in accordance with which a delay compensator circuit is connectable to a signal path of a circuit to be compensated. The delay compensator circuit comprises at least one test delay element having an input terminal and an output terminal and a timing generator and sequencer circuit coupled to the test delay element. The timing generator and sequencer circuit provides a test signal to the test delay element and monitors the output terminal of the test delay element at a given time after the test signal is provided to the test delay element. The timing generator and sequencer circuit further generates a delay select signal indicative of a voltage level at the output terminal of the test delay element at the given time. The delay compensator circuit further comprises at least one signal path delay element selectively connectable into the signal path of the circuit to be compensated, and a means for switching the signal path delay element into the signal path depending upon the delay select signal.

In accordance with a second aspect of the invention, a delay monitor circuit is provided for monitoring the delay of a test delay element having an input terminal and an output terminal. The delay monitor circuit comprises a timing generator and sequencer circuit coupled to the test delay element. The timing generator and sequencer circuit provides a test signal to the input terminal of the test delay element and monitors a voltage level at the output terminal of the test delay element at a given time after the test signal is provided to the test delay element. The timing generator and sequencer circuit generates a delay monitor output signal indicative of the voltage level at the output terminal of the test delay element at the given time.

The invention will be more readily understood by reference to the drawings and the detailed description. As will be appreciated by one skilled in the art, the invention is applicable to delay compensator circuits in general, and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
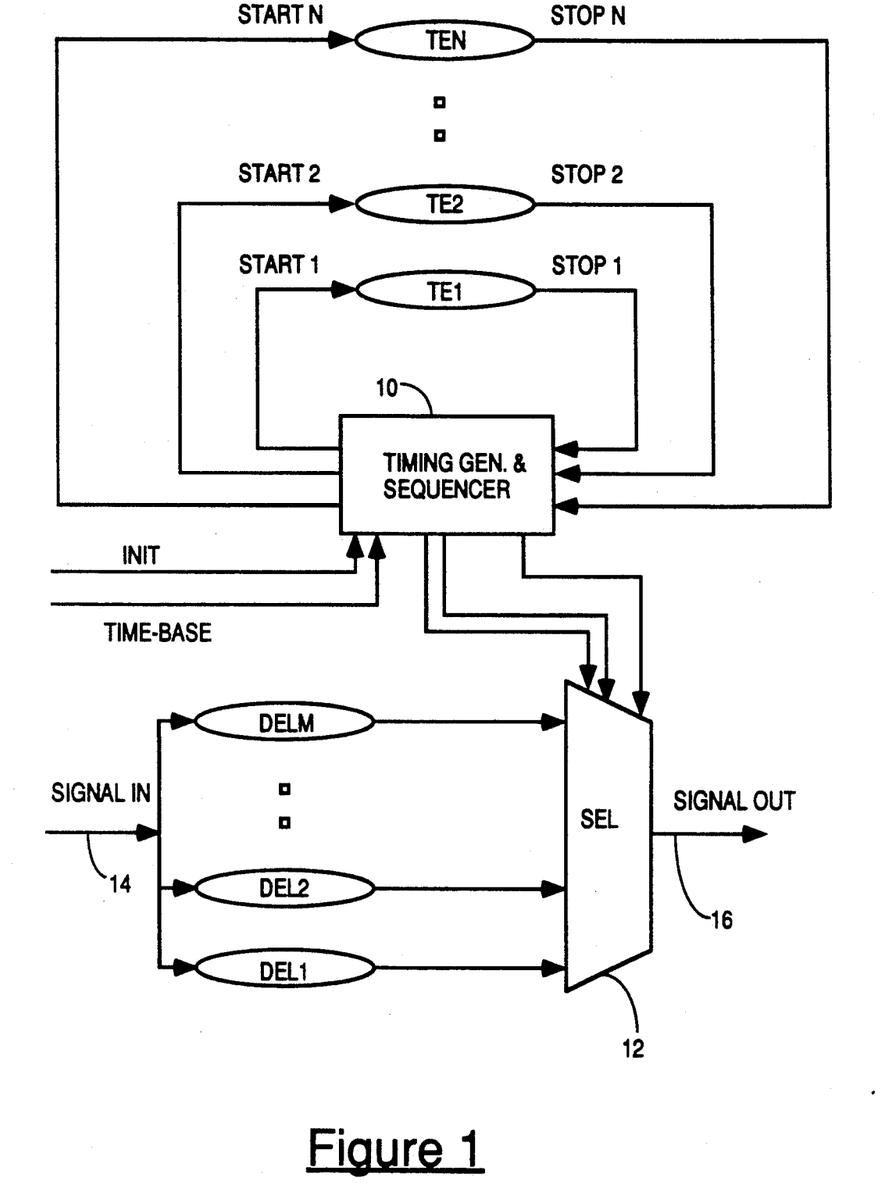
FIG. 1 is a general block diagram of a delay compensator circuit in accordance with the present invention.

FIG. 1 shows a block diagram of a delay compensator circuit in accordance with the present invention. The delay compensator circuit includes a timing generator and sequencer block 10, a multiplexer 12, a plurality of test delay elements TE1, TE2, ... TEN, and a plurality of signal path delay elements DEL1, DEL2, ... DELM. In this embodiment, the delay elements are implemented using delay lines. The delay elements could alternatively be implemented using subcircuits having a finite delay.

During operation of the delay compensator circuit, the timing generator and sequencer block 10 generates the sequencing and timing signals for the compensator circuit. A circuit to be compensated can be connected at the Signal In line 14 and at the Signal Out line 16. Delay elements TE1, TE2, ... TEN are used by the timing generator and sequencer 10 to measure the operating point of the overall circuit. Delay elements DEL1, DEL2, ... DELM are inserted into the signal path of the circuit to be compensated such that variations due to parameters such as temperature, voltage levels and processing variations are compensated. The timing generator and sequencer 10 generates signals that are provided to the select input terminals of multiplexer 12 to cause one of the delay elements DEL1-DELM to be switched into the signal path between lines 14 and 16. In the absence of the delay compensator circuit, a signal within the circuit to be compensated flows from the SIGNAL IN node directly to the SIGNAL OUT node. The timing generator and sequencer 10 receives a signal TIME-BASE from a time base (not shown in FIG. 1) to generate the various signals described below and is initialized if required by a signal INIT. The timing generator and sequencer 10 generates a plurality of signals STARTi (where i=1, ... N and where N is a positive integer) which propagate through delay elements TEi to produce a plurality of signals STOPi. The STARTi to STOPi propagation delay is measured by the timing generator and sequencer 10 by means such as a counter or state machine. Based on the measured value through a particular delay element TEi, the timing generator and sequencer 10 generates select signals that cause multiplexer 12 to switch in the appropriate delay element DELj, where j=1, ... M (and where M is a positive integer), into the signal path to obtain delay compensation. The timing generator and sequencer 10 generates select signals such that when "worst case conditions" are encountered, the delay element DELj with the least delay is switched into the signal path. When "best case conditions" are encountered, the delay element DELj with the maximum delay is switched into the signal path. Other select signals are generated over the desired range of compensation points. It is noted that the delay circuits TEi and DELj may have any delay characteristics greater than or equal to zero. The exact delay values of DELj and TEi are implementation dependent and are derived based upon the delay compensation required over the range of operating conditions.

It is possible to use an independent measurement of circuit delays based on delay elements TEi since the circuit to be compensated that is generating the signal and the delay compensator circuit are assumed to be operating under similar conditions of temperature, voltage and process. This is typically true since the circuits are generally fabricated on the same piece of silicon. The time base signal can be assumed to be invariant to these changes since it is generated externally by precise devices such as crystals which usually have built-in measures and compensation as well as inherent characteristics to achieve such invariance.

Figure 2:
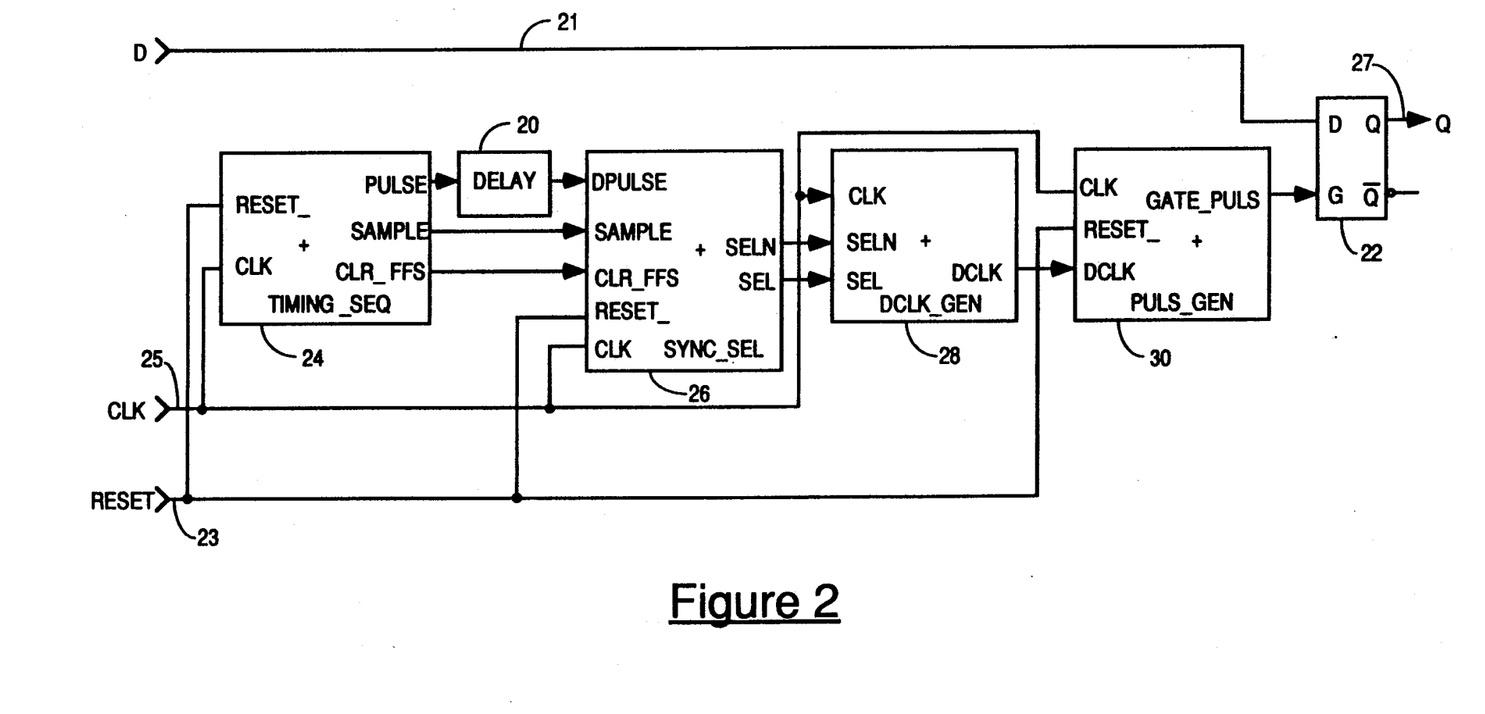
FIG. 2 is a block diagram of a specific embodiment of a delay circuit in accordance with the present invention.

A specific application of the delay compensator circuit in accordance with the present invention is next considered. The block diagram of FIG. 2 and the schematic diagrams of FIGS. 3-6 show an embodiment of the delay compensator circuit to solve the problems referred to above when the output delay time and the hold time requirements cannot be mutually met. Referring first to FIG. 2, the delay compensator circuit includes a delay circuit 20, a latch 22, a timing sequencer 24 (TIMING SEQ), a synchronizer and delay select generator 26 (SYNC SEL), a delayed clock generator 28 (DCLK GEN), and a gate pulse generator 30 (PULS GEN).

The input signals provided to the circuit include a data signal labelled D at line 21, a reset signal labelled RESET at line 23 and a time base signal labelled CLK at line 25. An output signal labelled Q is provided at line 27. The output signal Q may be driven through an output buffer to devices off-chip. It is noted that the signal path of the circuit to be compensated is connected at lines 21 and 27.

During operation, latch 22 is held transparent so that the output delay time of the data signal D is only affected by the flow-through delay of latch 22 as compared with the signal path delay in the absence of the compensation circuit. At the reference edge of signal CLK, latch 22 closes and its output terminal Q holds the value presented on its D input for the duration of the time that the latch 22 enable is held inactive. The delay compensator generates an inactive pulse signal labelled GATE_PULS that is provided to latch 22 and that has a width that is held relatively constant regardless of temperature, voltage and process variations.

FIGS. 3-6 are schematic diagrams illustrating the timing sequencer 24, the synchronizer and delay select generator 26, the delayed clock generator 28, and the gate pulse generator 30. The timing sequencer 24 comprises flip-flops 32 and 33, a NAND gate 45, and NOR gates 48 and 49. The synchronizer and delay select generator 26 comprises flip-flops 34-36 and 50. The delayed clock generator 28 comprises delay circuits 56 and 57, a multiplexer 55, and an inverter 60. Finally, the gate pulse generator 30 comprises flip-flops 40 and 41 and a multiplexer 56.

Figure 3:
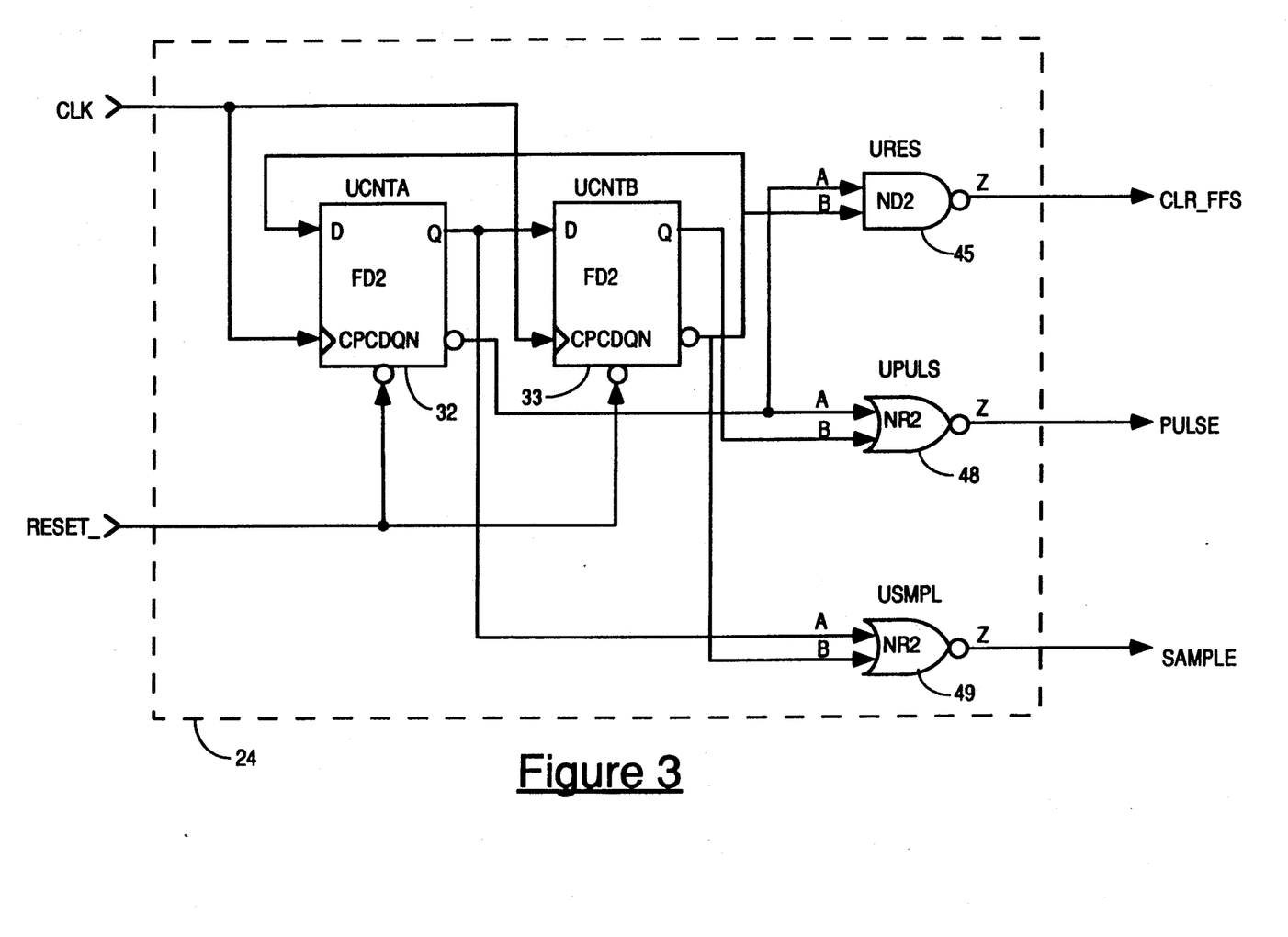
FIG. 3 is a schematic diagram of the timing sequencer block.
Figure 4:
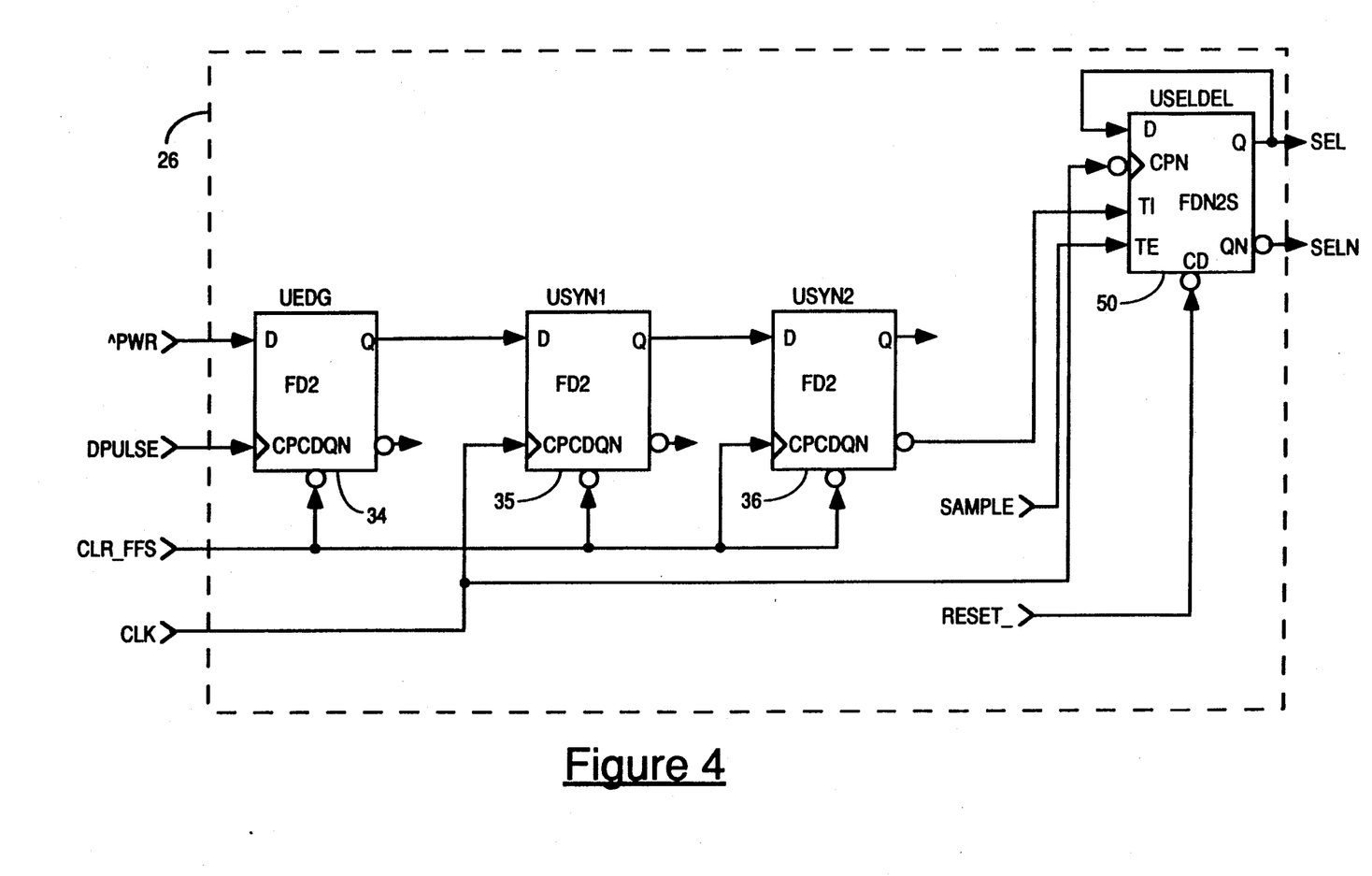
FIG. 4 is a schematic diagram of the synchronizer and delay select generator block.

During operation of the circuit, the timing sequencer 24 generates a test pulse signal that is transmitted through delay element 20 and that is received by the synchronizer and delay select generator 26 following a delay. The timing sequencer 24 also provides a trigger signal to cause the synchronizer and delay select generator 26 to sample the DPULSE input line at a given time after the fast pulse signal is provided to delay element 20. The synchronizer and delay select generator 26 thereby determines whether the pulse has propagated through the delay element 20 within the given time and correspondingly generates an output signal indicative of the delay of element 20.

Table 1 includes a brief description of the various circuit blocks and elements shown in FIGS. 2-6, as well as a brief description of their respective input and output lines.

TABLE I

| Block | Description |
|---|---|
| Delay circuit 20 | Delay element used to calibrate operating point of circuit. |
| Latch 22 | Transparent latch. D → input, Q → output, QN → inverted output G → gate enable. |
| Timing Sequencer 24 | Timing sequencer. RESET. → reset input, CLK → time base input, CLR.FFS → Local clear for flip-flops in SYNC.SEL, PULSE → START pulse for delay element input, SAMPLE → sample pulse for STOP condition. |
| SYNC.SEL 26 | Synchronizer and delay select generator. DPULSE → delayed PULSE, RESET → reset, CLK → time base, SAMPLE → sample pulse, CLR.FFS → local clear for internal flip-flops, SEL → select, SELN → inverted select. |
| Delayed Clock | Delayed clock generator. |

TABLE I-continued

| Block | Description |
|---|---|
| Generator 28 | CLK → time base. SEL → delay select, SELN → inverted delay select, DCLK → delayed clock. |
| Pulse Generator 30 | Gate pulse generator. CLK → time base, DCLK → delayed clock, RESET → reset. |
| Flip-Flops 32-36 | Positive edge triggered D flip-flop with asynchronous clear. |
| Flip-Flops 40-41 | Positive edge triggered D flip-flop with asynchronous clear, high-drive variant. |
| NAND Gates 45-46 | Two input NAND gate. |
| NOR Gates 48-49 | Two input NOR gate. |
| Flip-Flop 50 | Negative edge triggered scan D flip-flop with asynchronous clear. TI is the scan input. TE is scan enable. TE selects between D and TI inputs. Flip-flop 50 is used as a 2 input D flip-flop with select here. |
| Multiplexers 55-56 | Two-to-one multiplexer with dual polarity selects. Inverted output. |
| Inverter 60 | Inverter buffer. |

The operation of he timing sequencer 24 is next described with reference to the following algorithm as shown in Table II.

TABLE II

| Algorithm for Continuously Monitoring Circuit Delays | | |
|---|---|---|
| Step 1. | Clear sampling and synchronization flip flops; | |
| Step 2. | Generate input pulse; | |
| Step 3. | Wait for design-delay; | |
| Step 4. | Sample output of synchronized delayed pulse: | |
| | a. | Output =. true if pulse is sampled; |
| | b. | Output = false is pulse is not sampled; |
| Step 5. | Return to Step 1. | |

Assertion of signal RESET clears and initializes the storage elements in he circuit. Referring to FIG. 3, the timing sequencer 24 includes a counter comprising flip-flops 32 and 33 and decode logic comprising NAND gate 45 and NOR gates 48 and 49. NAND gate 45 generates a local clear signal CLR_FFS for some o the storage elements within the delay compensator. NOR gate 48 generates a signal PULSE that is transmitted through the delay element 20. NOR gate 49 generates a signal SAMPLE that enables the synchronizer and delay select generator 26 to register the correct control signal. The timing sequencer 24 steps through a sequence of CLEAR (active low), PULSE (active high), NOP (no operation or wait) and SAMPLE (active high) in a cyclic manner as shown in Table III.

TABLE III

| Flip-Flop 32 (Q output) | Flip-Flop 33 (Q outout) | Action |
|---|---|---|
| 0 | 0 | pulse signal CLR.FFS |
| 1 | 0 | Pulse signal PULSE |
| 1 | 1 | — |
| 0 | 1 | pulse signal SAMPLE |

Referring next to FIG. 4, the synchronizer and delay select generator 26 includes flip-flops 34-36 and 50. Flip-flop 34 is used as an edge detector to detect the emergence of the pulse through the delay element 20.

Figure 5:
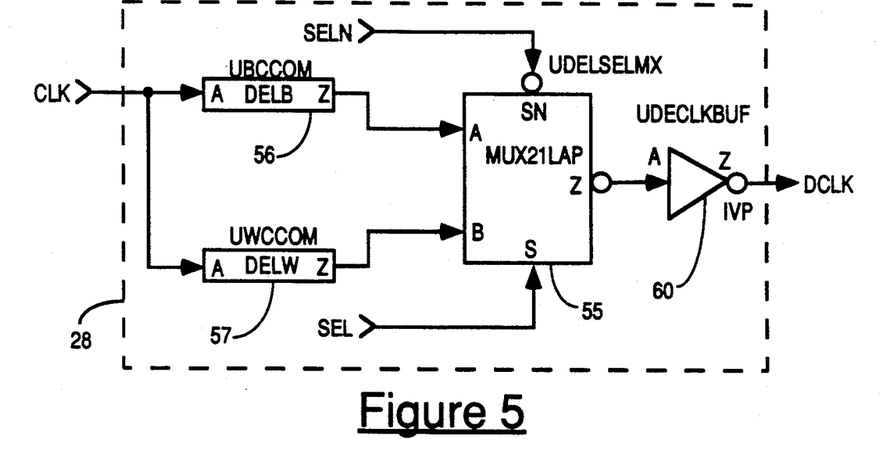
FIG. 5 is a schematic diagram of the delayed clock generator block.

Flip-flops 35 and 36 perform the function of synchronizing the asynchronous pulse-edge detected by the edge detector flip-flop 34. The output of flip-flop 36 is provided to flip-flop 50, while the SAMPLE pulse enables the falling edge of the clock signal CLK to register the new value. In the absence of the SAMPLE pulse, the old value is preserved. The output signals of flip-flop 50 labelled SEL and SELN are used to select one of the two delays of the delayed clock generator 28. Referring to FIG. 5, the delay of delay circuit 56 is chosen to be a value whose "Best Case Condition" value is the desired inactive pulse width (less the delay through multiplexer 55, inverter 60, flip-flop 41, multiplexer 56 and latch 22). Similarly, the delay of delay circuit 57 is chosen to have a value whose "Worst Case Condition" value is the desired inactive pulse width (less the delay through the above-mentioned elements). For example, if the "worst case" conditions are such that they are twice typical conditions, then the value chosen for delay circuit 56 is the (desired value)/2 in typical delay units. Similarly, if the "best case" conditions cause a speed up of 2 with respect to the typical conditions, then the value of delay circuit 56 is chosen to be (desired value) * 2 in typical delay units.

In the above example the typical case conditions would have a multiplier of 1. Best case and worst case conditions would have multiplexers of 0.5 and 2 respectively. The choice of the delay element is based on a trip point somewhere between the "best case" and "worst case" conditions. The trip point may be chosen based on a graph of the variations of the path delays through the delay circuits 56 and 57 to the latch 22 output 27, respectively. This graph represents the design space of "worst case" to "best case" for these two paths. A trip point is chosen so that the combined graph does not dip below the minimum desired value or required hold time at best case conditions. Caution must be taken so that the high delays of these paths do not exceed the output delay requirements. Once a trip point is determined, the value of delay circuit 20 is set to be (Clock Period) * trip point (in typical delay units). Therefore, if the process, temperature and voltage conditions are to the right of the trip point (towards Best Case Conditions), the delay circuit 56 is selected and if they are to the left (towards Worst Case Conditions), the delay circuit 57 is selected. This has the effect of stabilizing the "best case" to "worst case" spread. Inverter 60 buffers the delayed clock generated by this operation and provides an output signal labelled DCLK. It is noted that the circuit designer should consider these delays compared to the total path delay through to the latch enable since they have a significant influence on the total path delay.

Figure 6:
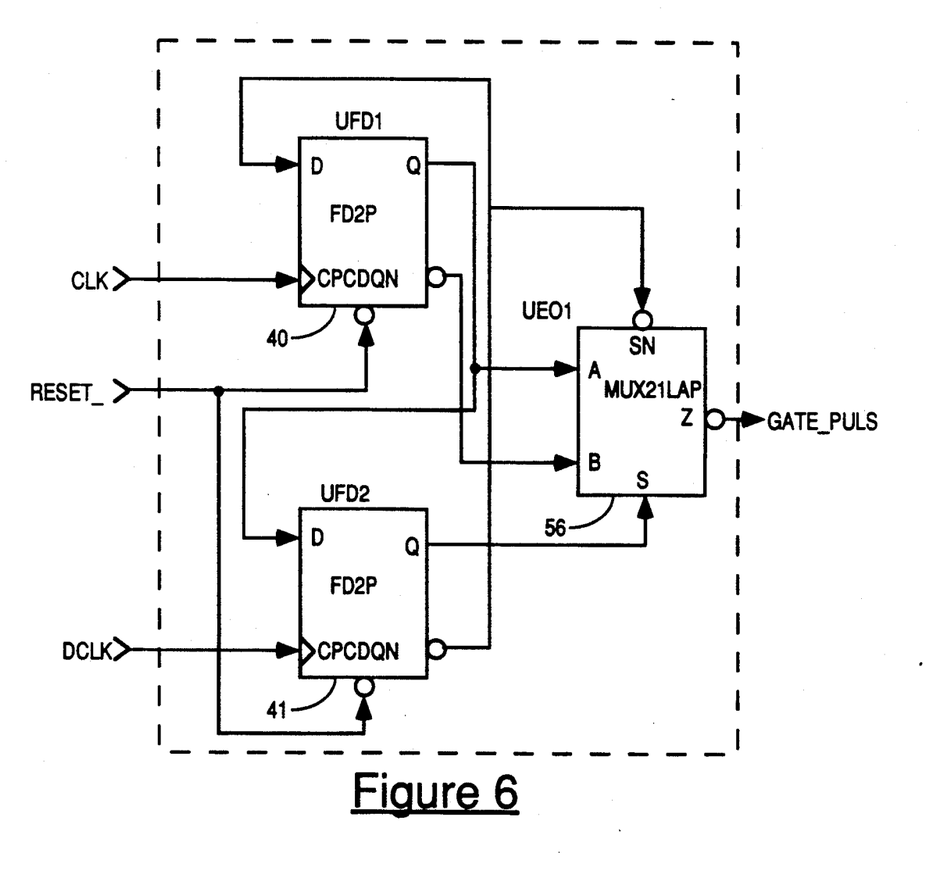
FIG. 6 is a schematic diagram of the gate pulse generator block.

Finally, referring to FIG. 6, flip-flops 40 and 41 and multiplexer 56 compare the rising edges of the signals CLK and the delayed clock signal DCLK to generate the inactive pulse for the output latch 22. Flip-flops 40 and 41 act as an edge detector and multiplexer 56 is used as an exclusive OR gate to compare their outputs. The rising edge of the signal CLK closes the latch 22, and the rising edge of the delayed clock signal DCLK opens the latch 22. The width of the signal GATE_PULS is therefore relatively constant regardless of variations in temperature, voltage and process. The delay measurement and selection of signal delays is a continuously tracking process since the time base signal CLK is a free running signal.

Alternate methods of construction include the usage of different time base sources. For example, counters or finite state machines that use clock or time base signals generated by phase locked loop circuits or oscillator circuits can be utilized. Better measurement granularity may be obtained by using a finer time base or by increasing the number of time base units before sampling. The delay that is switched into the circuit may consist of a choice of a number of delays including no delay where the latch is either left open (transparent) or where the clock signal is directly connected to one of the inputs of a multiplexer. If a number of delays are required to be switched in for greater stability over the design space, the control signals are appropriately generated by the timing sequencer and the number of delay elements (e.g., UTE1, UTE2, etc.), edge detectors, synchronizers etc. are increased. Embodiments are also possible that provide compensation over a time base frequency range. In this case, the trip points would move with the change in frequency and the circuit requirements could still be met.

Different applications of the delay compensator principles are also possible. Although the embodiment described in detail above is the specific case of an output signal timing specification requirement, other applications will be readily apparent to those skilled in the art. The application will dictate the exact implementation in terms of latching elements, time bases, delay measurement circuits, etc.

It is also evident that the timing sequencer block 24, the delay element 20, and the synchronizer and delay select generator block 26 may be utilized in combination as a delay monitor. In such a case, the output lines of the synchronizer and delay select generator 26 provide a signal indicative of the delay of delay element 20.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

We claim:

1. A delay compensator circuit connectable to a signal path of a circuit to be compensated, said delay compensator circuit comprising:
   at least one test delay element having an input terminal and an output terminal;
   a timing generator and sequencer circuit coupled to said test delay element, said timing generator and sequencer circuit providing a test signal to the input terminal of said test delay element and monitoring the output terminal of said test delay element at a given time after said test signal is provided to said input terminal of said test delay element, wherein said timing generator and sequencer circuit generates a delay select signal indicative of a voltage level at said output terminal of said test delay element at the given time;
   at least one signal path delay element selectively connectable into the signal path of the circuit to be compensated; and
   means for switching said signal path delay element into said signal path depending upon said delay select signal.

2. The delay compensator circuit as recited in claim 1 comprising additional signal path delay elements each selectively connectable into the signal path of the circuit to be compensated depending upon said delay select signal.

3. The delay compensator circuit as recited in claim 2 further comprising additional test delay elements each having an input terminal and an output terminal coupled to said timing generator and sequencer circuit, wherein said timing generator and sequencer circuit provides the test signal to each of said additional test delay elements and monitors the voltage level at the output terminals of each additional test delay element at the given time, and generates separate delay select signals each indicative of the voltage level at the output terminals of each test delay element at the given time.

4. The delay compensator circuit as recited in claim 1 wherein said timing generator and sequencer circuit comprises a first and a second flip-flop connected to receive an externally generated clock signal and for generating said test signal.

5. The delay compensator circuit as recited in claim 1 wherein said test delay element is a delay line.

6. The delay compensator circuit as recited in claim 1 wherein said means for switching said signal path delay element into said signal path includes a multiplexer.

7. A delay monitor circuit for monitoring the delay of a test delay element having an input terminal and an output terminal, said delay monitor circuit comprising a timing generator and sequencer circuit coupled to said test delay element, said timing generator and sequencer circuit providing a test signal to the input terminal of said test delay element and monitoring a voltage level at the output terminal of said test delay element at a given time after said test signal is provided to said input terminal of said test delay element, wherein said timing generator and sequencer circuit generates a delay monitor output signal indicative of the voltage level at said output terminal of said test delay element at the given time.

* * * * *